United States Patent
Lee et al.

(10) Patent No.: US 10,436,404 B2
(45) Date of Patent: Oct. 8, 2019

(54) LIGHTING DEVICE AND VEHICLE LAMP INCLUDING SAME

(71) Applicant: LG INNOTEK CO., LTD., Seoul (KR)

(72) Inventors: Byoung Eon Lee, Seoul (KR); Gyeong Il Jin, Seoul (KR); Kwang Ho Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/577,264

(22) PCT Filed: May 27, 2016

(86) PCT No.: PCT/KR2016/005648
§ 371 (c)(1),
(2) Date: Nov. 27, 2017

(87) PCT Pub. No.: WO2016/190709
PCT Pub. Date: Dec. 1, 2016

(65) Prior Publication Data
US 2018/0149325 A1    May 31, 2018

(30) Foreign Application Priority Data
May 28, 2015  (KR) .................. 10-2015-0075398

(51) Int. Cl.
*F21S 41/24* (2018.01)
*F21S 2/00* (2016.01)
(Continued)

(52) U.S. Cl.
CPC .............. *F21S 41/24* (2018.01); *F21K 9/61* (2016.08); *F21S 2/00* (2013.01); *F21S 41/19* (2018.01);
(Continued)

(58) Field of Classification Search
CPC ... F21K 9/61; F21S 41/19; F21S 41/24; F21S 41/32; F21S 41/37; F21S 43/14;
(Continued)

(56) References Cited

U.S. PATENT DOCUMENTS 6,981,791 B2 *  1/2006  Higashiyama ....... G02B 6/0038
                                                     349/61
8,264,622 B2 *  9/2012  Gourlay .............. G02B 6/0065
                                                     101/129
(Continued)

FOREIGN PATENT DOCUMENTS

EP    2696135 A2    2/2014
GB    2454928 A     5/2009
(Continued)

OTHER PUBLICATIONS

International Search Report in International Application No. PCT/KR2016/005648, filed May 27, 2016.
(Continued)

*Primary Examiner* — Peggy A Neils
(74) *Attorney, Agent, or Firm* — Saliwanchik, Lloyd & Eisenschenk

(57) ABSTRACT

An embodiment of the present invention relates to a lighting device structure that can increase the degree of freedom of a light emitting surface and realize an effect of changing the shape and the three-dimensional feeling of light and there is provided a lighting device including a light guide layer in which light exit surfaces are formed on one surface and on the other surface opposite to the one surface; a light emitting module that is embedded in the light guide layer and disposed at an outer periphery of a light exit surface of the light guide layer; and a light-transmitting printed circuit board that mounts an light emitting device on the light emitting module and is disposed under the light guide layer.

20 Claims, 3 Drawing Sheets

(51) Int. Cl.

| | | |
|---|---|---|
| *F21V 7/00* | (2006.01) | |
| *F21K 9/61* | (2016.01) | |
| *F21S 41/37* | (2018.01) | |
| *F21S 41/19* | (2018.01) | |
| *F21S 41/40* | (2018.01) | |
| *F21S 41/32* | (2018.01) | |
| *F21S 43/145* | (2018.01) | |
| *F21S 43/20* | (2018.01) | |
| *F21S 43/237* | (2018.01) | |
| *F21S 43/245* | (2018.01) | |
| *F21V 8/00* | (2006.01) | |
| *H05K 1/02* | (2006.01) | |
| *H05K 1/18* | (2006.01) | |
| *F21Y 115/10* | (2016.01) | |

(52) U.S. Cl.
CPC ............... *F21S 41/32* (2018.01); *F21S 41/37* (2018.01); *F21S 41/40* (2018.01); *F21S 43/145* (2018.01); *F21S 43/237* (2018.01); *F21S 43/245* (2018.01); *F21S 43/26* (2018.01); *F21V 7/00* (2013.01); *G02B 6/0021* (2013.01); *H05K 1/0274* (2013.01); *F21Y 2115/10* (2016.08); *G02B 6/0041* (2013.01); *G02B 6/0065* (2013.01); *G02B 6/0073* (2013.01); *G02B 6/0083* (2013.01); *H05K 1/189* (2013.01); *H05K 2201/0108* (2013.01); *H05K 2201/10106* (2013.01)

(58) Field of Classification Search
CPC ........ F21S 43/237; F21S 43/245; F21S 43/26; F21Y 2115/10; F21Y 2109/00; G02B 6/0065; G02B 6/0073; G02B 6/0083; G02B 6/0051; G02F 1/133615; G02F 2001/133342
See application file for complete search history.

(56) References Cited

U.S. PATENT DOCUMENTS

| | | | | |
|---|---|---|---|---|
| 8,496,371 | B2* | 7/2013 | Chang | F21V 7/22 |
| | | | | 349/65 |
| 8,944,662 | B2* | 2/2015 | Thompson | F21V 3/049 |
| | | | | 362/613 |
| 9,488,769 | B2* | 11/2016 | Brick | G02B 6/0041 |
| 9,507,072 | B2* | 11/2016 | Wakui | G02B 6/0065 |
| 9,689,555 | B2* | 6/2017 | Baaijens | F21S 8/026 |
| 2010/0002414 | A1 | 1/2010 | Meir et al. | |
| 2010/0296025 | A1 | 11/2010 | Gourlay | |
| 2010/0321952 | A1* | 12/2010 | Coleman | F21S 8/04 |
| | | | | 362/607 |
| 2011/0317417 | A1 | 12/2011 | Gourlay | |
| 2012/0106147 | A1 | 5/2012 | Kim et al. | |
| 2014/0043819 | A1 | 2/2014 | Yang et al. | |
| 2014/0328082 | A1 | 11/2014 | Gourlay | |
| 2015/0253491 | A1 | 9/2015 | Laycock et al. | |
| 2015/0338054 | A1 | 11/2015 | Kim et al. | |
| 2016/0010815 | A1* | 1/2016 | Ji | F21S 6/003 |
| | | | | 362/611 |

FOREIGN PATENT DOCUMENTS

| | | |
|---|---|---|
| GB | 2498347 A | 7/2013 |
| JP | 2011-070865 A | 4/2011 |
| JP | 2013-218059 A | 10/2013 |
| KR | 10-2011-0126741 A | 11/2011 |
| KR | 10-2012-0046398 A | 5/2012 |
| KR | 10-2012-0132003 A | 12/2012 |
| KR | 10-2014-0078374 A | 6/2014 |
| KR | 10-2014-0078375 A | 6/2014 |
| WO | WO 2014/051394 A1 | 4/2014 |
| WO | WO-2014/053832 A1 | 4/2014 |

OTHER PUBLICATIONS

Supplementary European Search Report dated Feb. 9, 2018 in European Application No. 16800348.1.

* cited by examiner

[FIGURE 1]
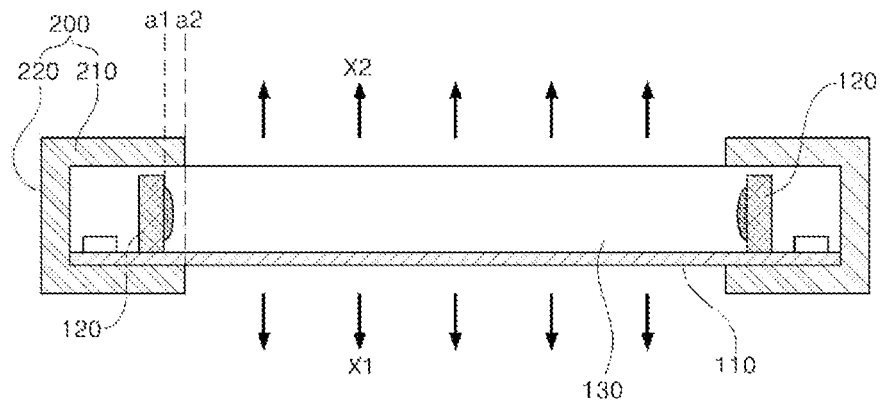
[FIGURE 2]
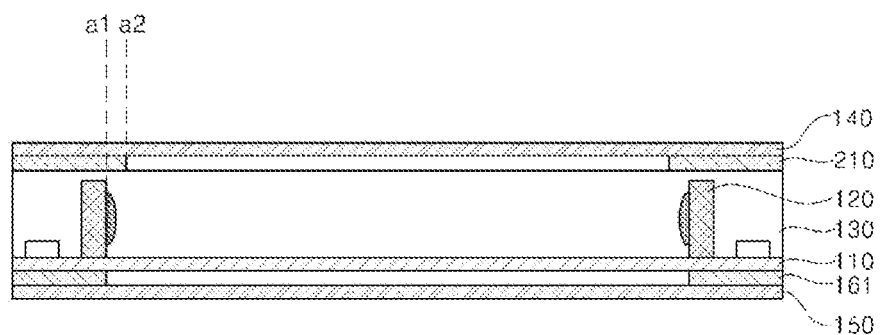
[FIGURE 3]
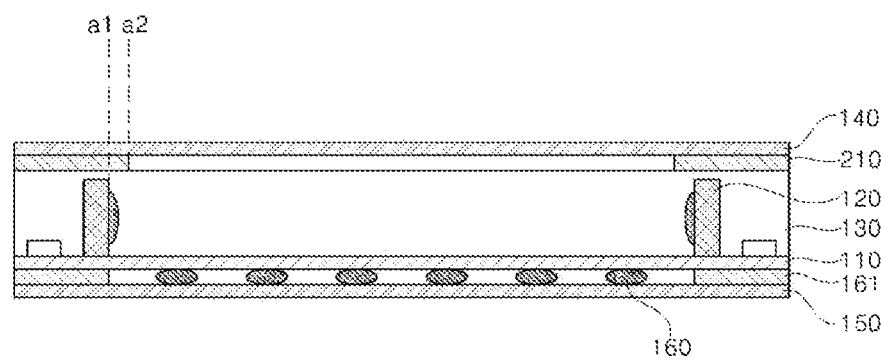

[FIGURE 4]
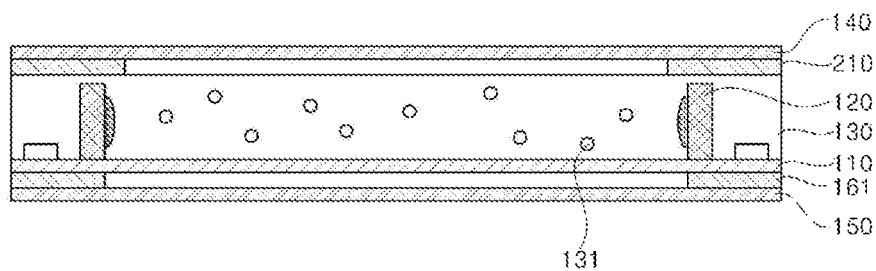
[FIGURE 5]
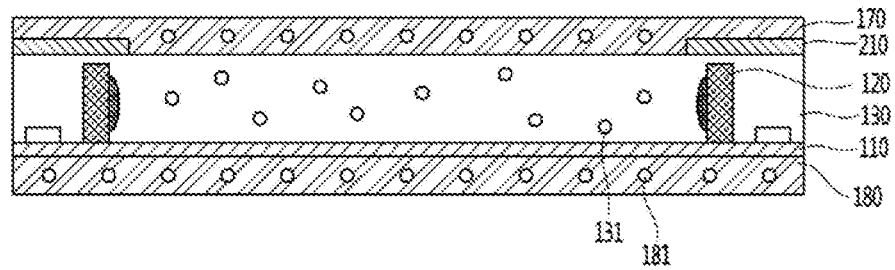
[FIGURE 6]
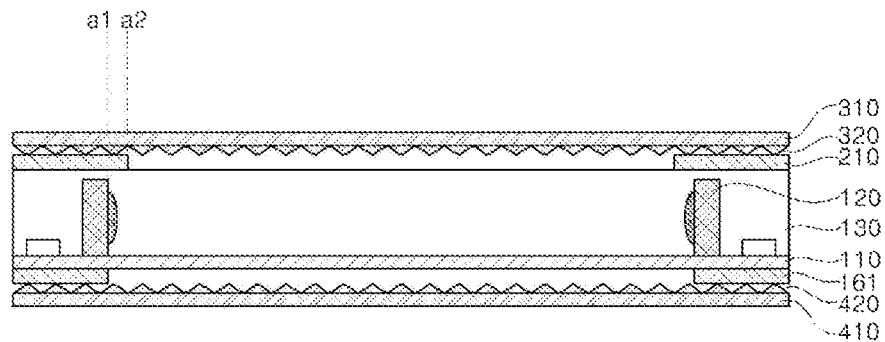
[FIGURE 7]
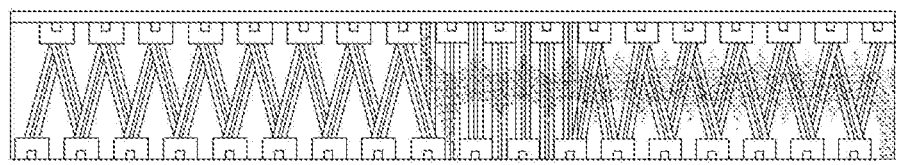

[FIGURE 8]
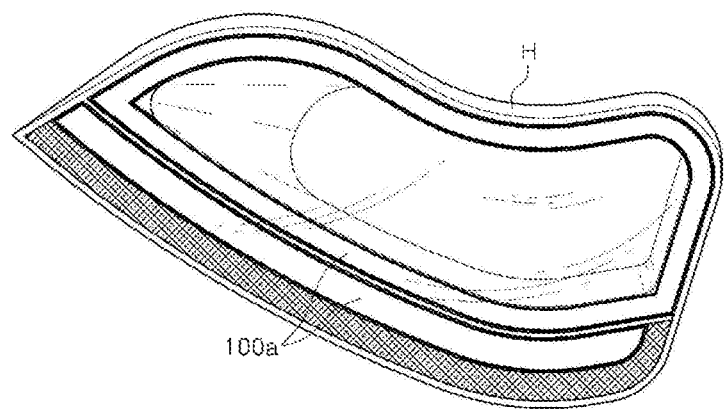

LIGHTING DEVICE AND VEHICLE LAMP INCLUDING SAME

CROSS-REFERENCE TO RELATED APPLICATIONS

This application is the U.S. national stage application of International Patent Application No. PCT/KR2016/005648, filed May 27, 2016, which claims priority to Korean Application No. 10-2015-0075398, filed May 28, 2015, the disclosures of each of which are incorporated herein by reference in their entirety.

TECHNICAL FIELD

Embodiments of the present invention relate to a lighting device structure that can increase the degree of freedom of a light emitting surface and realize an effect of changing the shape and a three-dimensional effect of a light.

BACKGROUND ART

The lighting unit can be applied variously to a backlight unit applied to a flat plate display, an interior lamp used in an indoor environment, a headlight, a fog light, a retraction light, a car-width light, a number light, a tail light, a brake light, turn signal light, emergency flashing light which are installed outside a vehicle, an indoor lighting installed inside a vehicle, or the like. Most of these lighting are mostly approaches in terms of brightness of a surface light source by applying a member such as a light guide plate that efficiently transmits light.

In a case of vehicle lighting, LEDs, which realize high optical efficiency, recently are being developed as a light source, and the use of LED packages as a light source is becoming more frequent in a case of vehicle lighting in a form of a surface lighting. However, in a case where the LED package is used as a light source, it is inevitably necessary to increase the number of optical elements that are responsible for the light emitting surface in case of where high light quantity is required or for the surface emitting and there are many problems in implementation of circuit between elements due to a cost aspect, the problem of heat dissipation, a curved portion of the vehicle, a narrow space, or the like and thus there is a fatal drawback that leads to high cost and low efficiency. Particularly, in a case of vehicle lighting disposed on in a limited space, many various designs are required, and in recent years, there has been an increasing demand for realizing three-dimensional light (3D) in light of a specific shape.

In addition, there is a growing need for a structure that can increase the degree of freedom of design and such attention is being extended to lighting that does not limit the light emitting surface to one direction.

DISCLOSURE

Technical Problem

The embodiments of the present invention are devised to solve the problems described above. In particular, the present invention can provide a lighting device that does not limit a light exit surface to one direction but can realize lighting in a structure in which light is emitted in both directions, and thus the degree of freedom of design according to the direction of light emitting can be increased.

In addition, a lighting device can be provided in which a light image can be realized as three-dimensional light having a depth feeling and a volume feeling in a bi-directional light emitting structure.

Technical Solution

As means of for solving the problems described above, according to an embodiment of the present invention, there is provided a lighting device including: a light guide layer in which light exit surfaces are formed on one surface and on the other surface opposite to the one surface; a light emitting module that is embedded in the light guide layer and disposed at an outer periphery of a light exit surface of the light guide layer; and a light-transmitting printed circuit board that mounts an light emitting device on the light emitting module and is disposed under the light guide layer.

Advantageous Effects

According to the embodiment of the present invention, there is an advantage that a lighting device is realized which can increase the degree of freedom of design according to a light exit direction by implementing the lighting having a structure in which light is exited in both directions without limiting the light exit surface to one direction.

In addition, according to the embodiment of the present invention, an effect is realized which changes shapes and a three-dimensional effect of light according to viewing angles by providing the optical member having a protruding optical pattern at a position corresponding to the light exit surface of the light guide member having the bi-directional light exit surface, and thus there is an effect that can provide a lighting device with improved aesthetics and an advantage that can be applied to various types of lighting device.

Furthermore, since the exit light exited from the light emitting module can be realized as three-dimensional light and the image of the surface light source can be realized, a separate external lens structure can be removed, thereby simplifying the structure of the lighting device.

In addition, according to the embodiment of the present invention, it is possible to control the length, thickness, and shape of the light that can be realized so that the three-dimensional feeling of the light itself can be sensed and at the same time, the flexibility of the device itself can be ensured, the device can be efficiently installed in various equipment or locations by guiding light by using a resin layer as a member for guiding light in a structure, and there are effects that the light efficiency can be increased, the number of light emitting units can be reduced, and the overall thickness of the lighting device can be reduced.

DESCRIPTION OF DRAWINGS

FIG. 1 is a conceptual cross-sectional view illustrating main portions of a lighting device according to an embodiment of the present invention.

FIG. 2 to FIG. 6 illustrate a structure of a lighting device according to another embodiment of the present invention.

FIG. 7 illustrates a three-dimensional light image according to FIG. 6.

FIG. 8 illustrates application of the lighting device according to the embodiments of the present invention illustrated in FIG. 1 to FIG. 7 described above to a vehicle lamp.

BEST MODE

Hereinafter, the configuration and operation according to the present invention will be described in detail referring to the accompanying drawings. In the following description referring to the accompanying drawings, the same reference numerals denote the same components regardless of the reference numerals and a duplicate description thereof will be omitted. Although the terms first, second, or the like may be used to describe various constituent elements, the constituent elements should not be limited by the terms. The terms are used only for the purpose of distinguishing one constituent element from another constituent element.

FIG. 1 is a conceptual cross-sectional view illustrating main portions of a lighting device according to an embodiment of the present invention.

Referring to FIG. 1, the lighting device according to an embodiment of the present invention includes a light guide member 130 which has light exit surfaces x1 and x2 on a surface and the other surface facing the surface, a light emitting module 120 which is embedded in the light guide member 130 and disposed at an outer periphery of a light exit surface of the light guide member, and a light transmitting printed circuit board 110 on which a light emitting device in the light emitting module is mounted and is disposed under the light guide member. In other words, the lighting device according to the embodiment of the present invention can be realized so that light can be exited from both surfaces of the light guide member and thus the degree of freedom of design in a disposition location thereof is maximized.

In other words, the light emitting module 120 is received in a structure of beings embedded in the light guide member 130 and the light exit direction of the light emitting module 120 is directed toward an inside portion of the light guide member 130. In this case, the light guide member 130 can diffuse and scatter light, and the surface light emission can be realized on the light exit surfaces x1 and x2, which are both surfaces of the light guide member, respectively.

Particularly, in the embodiment of the present invention, a light-transmitting printed circuit board is disposed on the other surface of the light guide member so that both-side light emission can be realized. The light-transmitting printed circuit board 110 is a printed circuit board on which a conductive pattern is formed on a transparent base substrate. In this embodiment, the light-transmitting printed circuit board 110 may have a light transmittance of 80% or more. In addition, the light intensity exiting through the light emitting surface x2 of one surface of the light guide member 130 and the light intensity exiting through the light exit surface x1 of the other surface are implemented differently. In this case, the intensity of light exited to the light exit surface x2 of one surface of the light guide member 130 can be larger than the light intensity exited through the light exit surface x1 of the other surface.

Although the light emitting module 120 may include one or a plurality of light emitting devices, a structure in which one light emitting device is provided in one light emitting module as a structure which can achieve a light efficiency with minimum cost will be described as an example. The light emitting device mounted on the light emitting module 120 may be a solid light emitting device and can apply any one light source selected from the group consisting of LED, OLED, laser diode (LD), laser, and VCSEL, as an example. In the present invention, the light emitting device to which the LED is applied will be described.

The light emitting device mounted on the light emitting module may be a side view type LED. In this case, the light emitting diode having a structure in which the light exit direction is not directly directed upward but exits toward the side can be used as a light emitting device of the present invention. According to this, since the lighting device 100a according to the embodiment of the present invention disposes the light emitting device 120 formed of a side view type light emitting diode directly inside the light guide member, it is possible to reduce the total number of the light emitting units and to innovatively reduce the total weight and thickness of the lighting device by the light being diffused and guided in the direction of the light exit surface by utilizing the light guide member which implements the light diffusion and reflection function.

The light-transmitting printed circuit board may apply a flexible substrate as a structure in which a conductive pattern is formed on a base substrate, and preferably uses a substrate having a light transmittance of 80% or more. As an example, any one of acrylic resin, polystyrene (PS), polymethyl methacrylate (PMMA), cyclic olefin copoly (COC), polyethylene terephthalate (PET) and polyimide film (PI) can be applied as the light-transmitting printed circuit board. In addition, the conductive pattern may be a circuit pattern realized by patterning an Ag paste or may be a Cu pattern patterned to have a thin thickness.

The lighting device according to the present embodiment may include a bezel portion 200 for receiving and supporting outer peripheries of the light guide member 130 and the light-transmitting printed circuit board 110 in an inside thereof. The bezel portion 200 may be disposed at an outer periphery of the light exit surface and a light reflection portion 210 corresponding to the upper portion of a disposition location of the light emitting device may protrude from a center portion of the light guide member. In particular, the light reflection portion 210 may include any one of Al, PC, PP, ABS, and PBT which are reflection materials. Alternatively, a reflection material including any one of Al, $TiO_2$, $CaCo_3$, $BaSo_4$, $Al_2O_3$, Silicon, and PS may be coated on the inner surface of a general synthetic resin or metal material. In particular, the light reflection portion 210 may be formed in a structure in which an end of the light reflection portion protrudes (a2) beyond a position where the light exit surface a1 of the light emitting device is disposed. This is for the purpose of maximizing the light utilization efficiency by reflecting the path of the light exited upward from the light emitting device and guiding the light to the inside portion of the light guide member again. Furthermore, the light reflection portion can also solve the hot spot problem, which is a deterioration phenomenon, on the upper surface of the light guide member formed of a resin material, which is generated as strong emitting light on one surface of the light guide member.

In addition, in the present embodiment, the bezel portion 200 may be formed as a structure which has a side portion 220 and a bottom portion that are bent at one end of the light reflection portion 210 and has a receiving portion which receives the outer periphery of the light-transmitting printed circuit board therein. Such a structure makes it possible to realize a stable lighting device structure while securing a light exit surface.

The light guide member 130 may be preferably formed of a flexible resin material so that the light guide member 130 can be freely designed in a narrow location where a housing of a vehicle lamp or an external lighting device is required. Particularly, in the embodiment of the present invention, since the light emitting device is embedded in the light guide member, the light emitting surface of the light emitting device which exits light and the resin material are in close contact with each other, a further feature of high heat resistance is required with respect to the light guide member 130. Therefore, in this embodiment, an ultraviolet curing resin or a silicone resin having high heat resistance can be applied to the light guide member 130. As another example, the light guide member 130 may be made of an ultraviolet curing resin including an oligomer. More specifically, the resin layer may be formed using a resin having urethane acrylate oligomer as a main raw material. For example, a resin obtained by mixing a urethane acrylate oligomer and a polyacrylic polymer type which are synthetic oligomers may be used as the resin layer. Of course, here, it may further include monomers mixed with isobornyl acrylate (IBOA), hydroxypropyl acrylate (HPA), 2-hydroxyethyl acrylate (2-HEA), or the like which are low boiling point diluent type reactive monomers, and as a photoinitiator (for example, 1-hydroxycyclohexyl phenyl-ketone or the like) or an antioxidant can be mixed therein as an additive. Such a mixture is advantageous in that not only high heat resistance is ensured but also the effect of dispersion and diffusion of light can be maximized.

FIG. 2 illustrates a structure of a lighting device according to another embodiment of the present invention.

Referring to FIG. 2, although the basic structure is the same as that of the embodiment of FIG. 1, there is a difference in that the optical members 140 and 150 disposed on the upper portion of the light guide member 130 or the lower portion 161 of the light-transmitting printed circuit board 110 are further provided. The optical members 140 and 150 perform a function of increasing the degree of diffusion of the exit light emitted through the light exit surface of the light guide member and securing the light uniformity. To this end, although the optical members 140 and 150 may be formed of an acrylic resin having a sheet or film structure, the present invention is not limited thereto. In addition, the optical members 140 and 150 may apply any material that can perform the diffusing function such as high permeability plastics including polystyrene (PS), polymethylmethacrylate (PMMA), and cyclic olefin copoly (COC), polyethylene terephthalate (PET), resin, or the like.

In addition, as illustrated in FIG. 3, a light diffusion pattern 160 implemented as a light diffusing material can be further implemented on the optical member 150 among the light exit surface of the light guide member 130 in a location where the light-transmitting printed circuit board 110 is disposed. According to this, the intensity and diffusion of the light emitted through the light-transmitting printed circuit board 110 are increased to increase the uniformity of the light.

Furthermore, as illustrated in FIG. 4, the light guide member 130 may further include a diffusion member 131 thereon having a particle structure in order to increase light diffusion. The diffusion member 131 may further include a plurality of bead structures in which a hollow (or an opening) is formed therein with mixed and diffused forms, and the diffusion member 131 serves to improve reflection and diffusion characteristics of light. For example, when the light exited from the light emitting module is incident on the diffusion member 131 in the light guide member 130, the light is reflected and transmitted through the hollow of the diffusion member 131, is diffused and condensed, and is exited to an upper portion of a light receiving layer. Although the diffusion member may be made of any one selected from the group consisting of silicon, silica, glass bubble, PMMA, urethane, Zn, Zr, $Al_2O_3$, and acryl and a particle size thereof may be formed in a range of 1 μm to 20 μm, the present invention is not limited thereto.

In addition, referring to FIG. 5 according to an embodiment of the present invention, a structure can be implemented in which light diffusion resin layers 170 and 180 are in close contact with a surface of the light guide member and a surface of the light-transmitting printed circuit board in place of the optical member described above. Of course, the structures of the other optical guide layer, the light emitting module, and the light transmitting printed circuit board are the same as those of FIG. 1. Since the layer which is implemented by the optical diffusion resin layers 170 and 180 can realize the diffusion effect of light and there is an advantage that the stability can be structurally ensured because the layer and the light guide member is in close contact with each other. Furthermore, since the diffusion member in FIG. 4 can be added to the interior of the light diffusion resin layer, it is very advantageous in ensuring uniformity of light. As illustrated in FIG. 5, the diffusion member 131 may be also provided in the interior of the light guide member as described above in the embodiment of FIG. 4.

FIG. 6 is a modification structure of the embodiment of the present invention described above referring to FIG. 2, there is a difference in that light can have a depth feeling and a three-dimensional feeling as illustrated in FIG. 6, such that the image formed on the light exit surface progresses in the depth direction of the light guide member. To this end, an optical member can be disposed in which protruding optical patterns 320 and 420 protruding in the direction of the light exit surface are implemented on the surfaces of the optical members 310 and 410 on one surface or the other surface of the light guide member 130. In this case, the protruding optical patterns 320 and 420 may be formed on the surface of the optical member in the direction in which the light exit surface of the light guide layer is disposed. By providing the optical member having the protruding optical pattern instead of the simple surface light emission, a geometrical light pattern can be formed to realize the effect of changing the shape and the three-dimensional effect of the light according to the viewing angle (see FIG. 7).

The protruding optical patterns 320 and 420 may be generally formed in a line pattern of which a cross-section of pattern protrudes from the surface of the transparent substrate 410 has a polygonal structure, or may be formed by any one of a prism sheet having a plurality of unit prism lens patterns, a microlens array sheet, and a lenticular lens sheet or a combination thereof.

According to the embodiment of the present invention, since the light guide member is made of a resin having flexibility and the thickness of the light guiding plate of the related art can be innovatively reduced, the thinness of the entire product can be realized and since a transparent printed circuit board is used, and the light exit surface can be implemented in both directions, there are an advantage of being easily applicable to the bent surface of the installation location, an advantage of improving the degree of freedom of design, and an advantage of being capable of being also applied to other vehicle lighting or flexible displays.

FIG. 8 illustrates the application of the lighting device according to the embodiment of the present invention illustrated in FIG. 1 to FIG. 7 to a vehicle lamp.

With referring to FIG. 8, a lighting device 100a according to the embodiment of the present invention has a constant flexibility by being applied a light guide member using resin and a flexible circuit board. Further, since it is formed by implementing a double-sided light-emitting structure, the degree of freedom of design is increased. Therefore, the lighting device can be easily mounted on the headlight housing for a vehicle having the bent shape as illustrated in FIG. 8 and thus there are an effect that can improves the degree of design freedom of the finished product combined with the housing and an effect that can obtain uniform brightness and illumination despite of improving the degree of design freedom.

Particularly, as described above, even if it is implemented in a very narrow space, light can be mixed to expand a light width and a structure can also be implemented which minimizes the space between the light emitting device and the three-dimensional light image having a depth feeling.

In the foregoing detailed description of the present invention, specific embodiments have been described. However, various modifications are possible within the scope of the present invention. The technical idea of the present invention should not be limited to the embodiments of the present invention but should be determined by the claims and equivalents thereof.

The invention claimed is:

1. A lighting device comprising:
a light guide member in which light exit surfaces are formed on an upper surface and on a lower surface opposite to the upper surface;
a light emitting module that is embedded in the light guide member and disposed at an outer periphery of the lower light exit surface of the light guide member, wherein the light emitting module includes a light emitting device;
a light-transmitting printed circuit board that mounts the light emitting device of the light emitting module and is disposed under the light guide member;
a first light reflection portion disposed above the light guide member and a second light reflection portion disposed under the light guide member; and
a first optical member disposed on an upper surface of the first light reflection portion and a second optical member disposed on a bottom surface of the second light reflection portion, the first and second optical members being configured to increase light diffusion through the upper and lower light exit surfaces of the light guide member, respectively;
wherein the first light reflection portion is disposed at an outer periphery of the upper light exit surface of the light guide member and corresponds to an upper portion of the light emitting device,
wherein the lighting device emits light in a direction of the upper light exit surface and a direction of the lower light exit surface of the light guide member.

2. The lighting device according to claim 1,
wherein the light-transmitting printed circuit board is in contact with the lower light exit surface of the light guide member and includes a conductive pattern layer.

3. The lighting device according to claim 2,
wherein the light-transmitting printed circuit board has a light transmittance of 80% or more.

4. The lighting device according to claim 2,
wherein the lighting device includes a bezel portion that receives and supports outer peripheries of the light guide member and the light-transmitting printed circuit board in an inside thereof.

5. The lighting device according to claim 4,
wherein the bezel portion is disposed at outer peripheries of the upper and lower light exit surfaces, and includes the first and second light reflection portions, and
wherein the first light reflection portion protrudes toward a center portion direction of the light guide member.

6. The lighting device according to claim 5,
wherein an end of the first light reflection portion protrudes toward the center portion direction of the light guide member from a position where the light emitting device is disposed.

7. The lighting device according to claim 5,
wherein the bezel portion extends from an end of the first light reflection portion adjacent to the upper light exit surface of the light guide member, and
wherein the bezel portion has a receiving portion that receives the outer peripheries of the light guide member and the light-transmitting printed circuit board therein.

8. The lighting device according to claim 1,
wherein the first optical member is disposed on the upper portion of the light guide member and the second optical member is disposed under a lower portion of the light-transmitting printed circuit board.

9. The lighting device according to claim 8,
wherein a protruding optical pattern that protrudes in a direction of the light exit surfaces is provided on a surface of the first or second optical member.

10. The lighting device according to claim 8, comprising a light diffusion pattern provided between the light-transmitting printed circuit board and the light guide member.

11. The lighting device according to claim 8, comprising a diffusion member provided in the light guide member,
wherein the light guide member includes a first portion between the upper portion of the light emitting device and the first light reflection portion and a second portion disposed outside a rear surface of the light emitting device, and
wherein the first and second portions of the light guide member overlap the first light reflection portion in a vertical direction.

12. The lighting device according to claim 1, comprising:
a light diffusion resin layer that is in close contact with the upper or lower light exit surface of the light guide member and a surface of the light-transmitting printed circuit board.

13. The lighting device according to claim 12,
wherein a diffusion member is further provided in the light guide member or the light diffusion resin layer.

14. The lighting device according to claim 12,
wherein the light diffusion resin layer is a light curing resin.

15. A vehicle lamp comprising:
a lighting device according to claim 1.

16. The lighting device according to claim 1,
wherein the light guide member is formed of a flexible resin material,
wherein a portion of the light guide member is disposed between the light emitting device and the first light reflection portion,
wherein the first light reflection portion contacts the upper light exit surface of the light guide member, and
wherein the portion of the light guide member overlaps the light emitting device in a vertical direction.

17. A lighting device comprising:
a printed circuit board including a transparent base substrate and a conductive pattern,
a light emitting module including a light emitting device and disposed on an outer periphery of the printed circuit board;
a light guide member that the light emitting module is embedded therein, a first light reflection portion disposed above the light guide member and a second light reflection portion disposed under the light guide member; and a first optical member disposed on an upper surface of the first light reflection portion and a second optical member disposed on a bottom surface of the second light reflection portion, the first and second optical members being configured to increase light diffusion through upper and lower surfaces of the light guide member, respectively;

wherein the first light reflection portion is disposed at an outer periphery of the light guide member and corresponds to an upper portion of the light emitting device;

wherein an upper surface of the printed circuit board contacts the lower surface of the light guide member, wherein the light guide member has the upper surface facing to the lower surface, wherein the lower surface and the upper surface of the light guide member each has a light exit surface for emitting light, wherein the light emitting module is disposed at an outer region of the lower light exit surface of the light guide member, wherein a light emitting surface of the light emitting device emits light in an inner direction of the light guide member and contacts the light guide member, and wherein the lighting device emits light through the upper surface of the light guide member and a lower surface of the printed circuit board.

18. The lighting device according to claim 17, wherein the light guide member is formed of a flexible resin material, wherein the first light reflection portion is fainted of a resin on the upper surface of the light guide member, wherein a portion of the light guide member is disposed between the light emitting device and the first light reflection portion, wherein the first light reflection portion contacts the upper surface of the light guide member, and wherein the portion of the light guide member overlaps the light emitting device in a vertical direction.

19. The lighting device according to claim 17, wherein light emitting module is disposed adjacent to both side surfaces of the light guide member facing each other at the outer periphery of the light guide member.

20. The lighting device according to claim 17, comprising a light diffusion pattern or a light diffusion resin layer provided between the printed circuit board and the light guide member.

* * * * *